US010768245B2

(12) United States Patent
Kelly et al.

(10) Patent No.: US 10,768,245 B2
(45) Date of Patent: Sep. 8, 2020

(54) COMPLIANT PIN WITH SELF SENSING DEFORMATION

(71) Applicant: INTERNATIONAL BUSINESS MACHINES CORPORATION, Armonk, NY (US)

(72) Inventors: Matthew S. Kelly, Oakville (CA); Joseph Kuczynski, North Port, FL (US); Scott B. King, Rochester, NY (US); Bruce Chamberlin, Vestal, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 162 days.

(21) Appl. No.: 16/144,585

(22) Filed: Sep. 27, 2018

(65) Prior Publication Data
US 2020/0103454 A1 Apr. 2, 2020

(51) Int. Cl.
| | |
|---|---|
| *G01R 31/04* | (2006.01) |
| *H01R 12/58* | (2011.01) |
| *H01R 13/74* | (2006.01) |
| *H01R 43/20* | (2006.01) |
| *H05K 3/30* | (2006.01) |
| *G01R 31/70* | (2020.01) |

(52) U.S. Cl.
CPC .......... *G01R 31/70* (2020.01); *H01R 12/585* (2013.01); *H01R 13/74* (2013.01); *H01R 43/205* (2013.01); *H05K 3/308* (2013.01); *H01R 2201/20* (2013.01); *H05K 2201/1075* (2013.01); *H05K 2201/10189* (2013.01); *H05K 2201/10303* (2013.01)

(58) Field of Classification Search
CPC ........ G01R 31/00; G01R 31/50; G01R 31/66; G01R 31/70; G01R 31/046; H01R 12/00; H01R 12/50; H01R 12/51; H01R 12/55; H01R 12/58; H01R 12/585; H01R 13/00; H01R 13/73; H01R 13/74; H01R 43/00; H01R 43/20; H01R 43/205; H01R 2201/20; H05K 3/00; H05K 3/30; H05K 3/306; H05K 3/308; H05K 2201/10189; H05K 2201/10303; H05K 2201/1075
USPC .............. 324/500, 537, 538, 754.01, 754.03, 324/754.07, 756.01, 756.02, 756.03
See application file for complete search history.

(56) References Cited

U.S. PATENT DOCUMENTS

| | | |
|---|---|---|
| 4,513,499 A | 4/1985 | Roldan |
| 4,759,721 A | 7/1988 | Moore et al. |
| 4,857,018 A | 8/1989 | Pickles |
| 4,878,861 A | 11/1989 | Kendall |

(Continued)

*Primary Examiner* — Hoai-An D. Nguyen
(74) *Attorney, Agent, or Firm* — Cantor Colburn LLP; Tihon Poltavets

(57) ABSTRACT

A compliant pin system includes a pin having a compliant section including a first leg and an opposing second leg. A first plurality of contact members extend along the first leg. A second plurality of contact members extend along the second leg. A pin validation system is operatively connected to the first plurality of contact members and the second plurality of contact members. The pin validation system detects a presence of an electrical signal passing between corresponding pairs of the first plurality of contact members and the second plurality of contact members to determine an integrity of the compliant pin.

10 Claims, 3 Drawing Sheets

(56) References Cited

U.S. PATENT DOCUMENTS

| | | | |
|---|---|---|---|
| 5,940,967 A | 8/1999 | Wuyts et al. | |
| 6,071,152 A * | 6/2000 | Achammer | H01R 13/41 439/733.1 |
| 7,008,272 B2 | 3/2006 | Blossfeld | |
| 7,255,612 B2 | 8/2007 | Noguchi | |
| 7,458,274 B2 | 12/2008 | Lamb et al. | |
| 8,747,124 B2 | 6/2014 | Trout | |
| 9,806,443 B1 * | 10/2017 | Thackston | H01R 12/585 |
| 10,003,145 B1 * | 6/2018 | Annis | H01R 12/716 |
| 2001/0025206 A1 * | 9/2001 | Takada | G01R 31/69 700/150 |
| 2004/0097141 A1 * | 5/2004 | Belopolsky | H01R 12/737 439/857 |
| 2008/0176452 A1 * | 7/2008 | Fedder | H01R 12/585 439/638 |
| 2011/0189895 A1 * | 8/2011 | Ito | H01R 24/38 439/629 |
| 2013/0017732 A1 * | 1/2013 | Parke | H01R 13/641 439/660 |
| 2013/0038029 A1 * | 2/2013 | Okonski, Jr. | F16J 15/062 277/647 |
| 2014/0018830 A1 * | 1/2014 | Shelton, IV | A61B 17/122 606/157 |
| 2018/0205184 A1 * | 7/2018 | Briant | H01R 12/58 |
| 2018/0337475 A1 * | 11/2018 | Teichmann | H01R 4/58 |
| 2019/0020160 A1 * | 1/2019 | Rabacchi | H01R 31/065 |
| 2020/0057102 A1 * | 2/2020 | Hugo | G01R 31/70 |

* cited by examiner

COMPLIANT PIN WITH SELF SENSING DEFORMATION

BACKGROUND

The present invention relates to the art of electrical connectors and, more particularly to a compliant pin having a self-sensing deformation system.

Many electrical assemblies employ plated through holes (PTH) when forming electrical connections between components. An electrical component may include compliant pins that are forced through the PTH's to establish the connection. Compliant pins include a deformation zone that promotes the connection with electrical surfaces in the PTH.

The compliant region includes two surfaces that may be brought together under force. That is, during insertion, the compliant region may deform, e.g., the two surfaces being brought together. Depending upon installation force, the compliant pins may fail. That is, during insertion a pin may not seat within a PTH or a pin may be loose in a PTH. After insertion, a test is conducted to ensure that each compliant pin is in electrical contact with a corresponding PTH. The test is time-consuming and costly. Further, over time, the compliant pin may lose resiliency and subsequently become loose creating a poor electrical connection.

SUMMARY

According to an embodiment of the present invention, a compliant pin system includes a pin having a first end, a second end, and an intermediate portion. A compliant section is provided at the intermediate portion. The compliant section includes a first leg and an opposing second leg. The second leg is spaced from the first leg by a deformation zone. A first plurality of contact members extend along the first leg. A second plurality of contact members extend along the second leg. The second plurality of contact members is substantially aligned with the first plurality of contact members. A first plurality of electrical conductors is arranged along the first leg. Each of the first plurality of electrical conductors includes an end portion terminating at a corresponding one of the first plurality of contacts. A second plurality of electrical conductors is arranged along the second leg. Each of the second plurality of electrical conductors includes an end section terminating at a corresponding one of the second plurality of contacts. A pin validation system is operatively connected to the first plurality of electrical conductors and the second plurality of electrical conductors. The pin validation system detects a presence of an electrical signal passing between corresponding pairs of the first plurality of contact members and the second plurality of contact members to determine an integrity of the compliant pin.

According to another embodiment of the present invention, A method of checking integrity of a compliant pin includes sending a signal along a first plurality of conductors toward a first plurality of contact members extending along a first leg portion of the compliant pin, inserting the compliant pin into a plated through hole moving the first leg portion and a second leg portion towards one another, sensing for the signals at a second plurality of contact members extending along the second leg portion through a second plurality of conductor members, and determining the integrity of the compliant pin based on one of a presence of and absence of the signals at the second plurality of conductor members.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
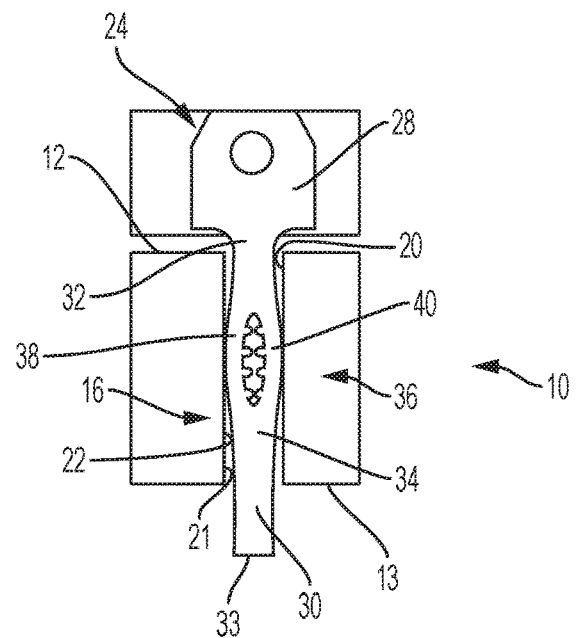
FIG. 1 depicts a printed circuit board (PCB) including a plated through hole (PTH) receptive of a compliant pin, in accordance with an aspect of an exemplary embodiment.

With reference now to FIG. 1, a printed circuit board (PCB) is indicated generally at 10. PCB 10 includes a first surface 12 and an opposing second surface 13. A plated through hole (PTH) 16 extends from first surface 12 through second surface 13. PTH 16 includes a first end portion 20, a second end portion 21, and an intermediate section 22. First end portion 20, second end portion 21, and intermediate section 22 are electrically conductive and are connected to circuitry (not shown) carried by PCB 10. A compliant pin 24 is shown installed in PTH 16. Compliant pin 24 provides an interface between an electrical component (not separately labeled) such as an electronic chip and PCB 10.

Figure 2:
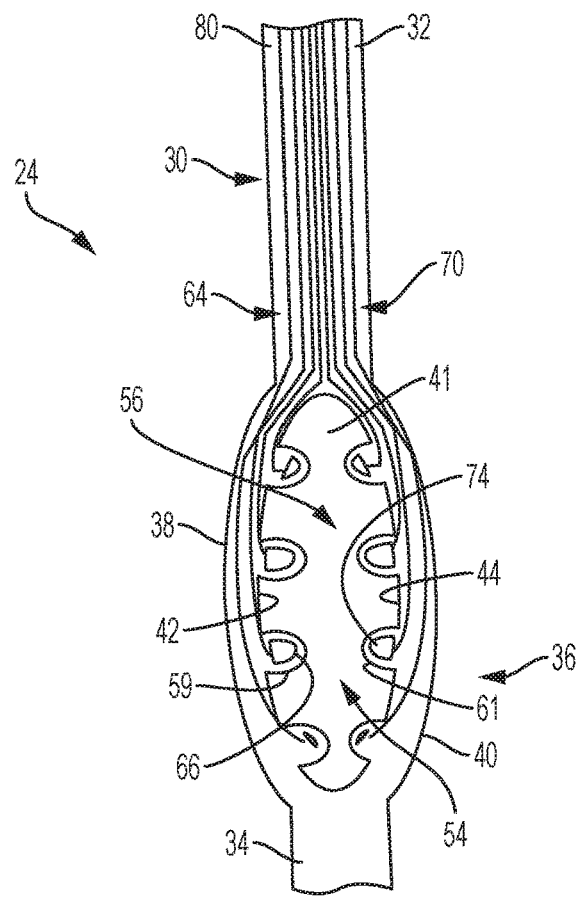
FIG. 2 depicts a partial plan view, of a compliant pin, in accordance with an aspect of an exemplary embodiment.

In an embodiment, compliant pin 24 includes a head end 28 and a pin end 30. Head end 28 may be embedded in the electrical component that interfaces with PCB 10. Referring to FIG. 2, and with continued reference to FIG. 1, pin end 30 includes a first end 32, a second end 33, and an intermediate portion 34. Intermediate portion 34 includes a compliant section 36 which, when compressed, may exert a radially outwardly directed force. That is, once installed in PCB 10, compliant section 36 exerts an outwardly directed force that secures compliant pin 24 to PTH 16. In the embodiment shown, compliant section 36 includes a first leg 38 and a second leg 40 that are separated by a void or opening 41. First leg 38 includes a first inner surface 42 and second leg 40 includes a second inner surface 44.

In an embodiment, first inner surface 42 supports a first plurality of contact members 54 and second inner surface 44 supports a second plurality of contact member 56. First plurality of contact members 54 may take the form of a first plurality of bumps, one of which is indicated at 59. Bumps 59 may take on a variety of shapes and forms. Similarly, second plurality of contact members 56 may take the form of a second plurality of bumps, one of which is indicated at 61. Bumps 61 may take on a variety of shapes and forms.

In accordance with an exemplary aspect, a first plurality of conductors 64 extend along first leg 38 from first end 32. Each of the first plurality of conductors 64 includes a terminal end, one of which is shown at 66, that terminates at a corresponding one of the first plurality of bumps 59. A second plurality of conductors 70 extend along second leg 40 from first end 32. Each of the second plurality of conductors 70 includes a terminal end, one of which is shown at 74, that terminates at a corresponding one of the second plurality of bumps 61. First and second pluralities of conductors 64 and 70 may be applied to a non-conductive coating material 80 that is applied to and covers pin end 30.

Figure 3:
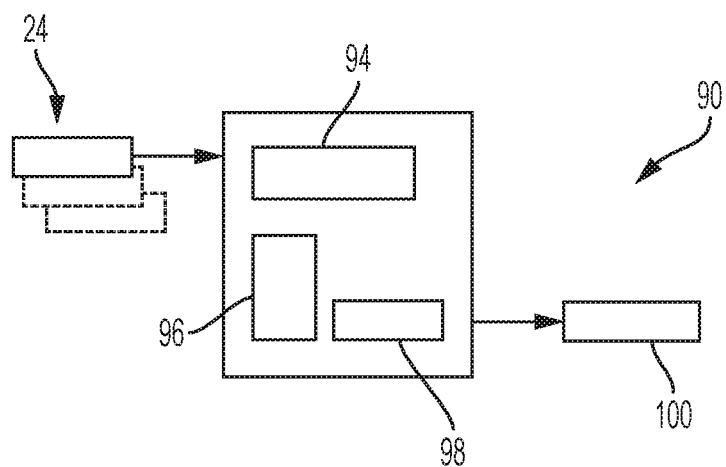
FIG. 3 depicts a block diagram illustrating a compliant pin monitoring system, in accordance with an aspect of an exemplary embodiment.

Reference will now follow to FIG. 3 in describing a compliant pin monitoring system 90 in accordance with an exemplary embodiment. Compliant pin monitoring system 90 includes a processor 94. Processor 94 may take the form of a central processor unit (CPU) or a graphic processor unit (GPU). Processor 94 may be operatively connected to a non-volatile memory 96 and a pin monitoring module 98. Each of the first plurality of conductors 64 and the second plurality of conductors 70 on each compliant pin 24 is connected to compliant pin monitoring system 90. Based on inputs received through the first plurality of conductors 64 and the second plurality of conductors 70, pin monitoring module 98 may issue an alert 100 prompting a technician to evaluate whether an issue has occurred in a particular pin.

Figure 4:
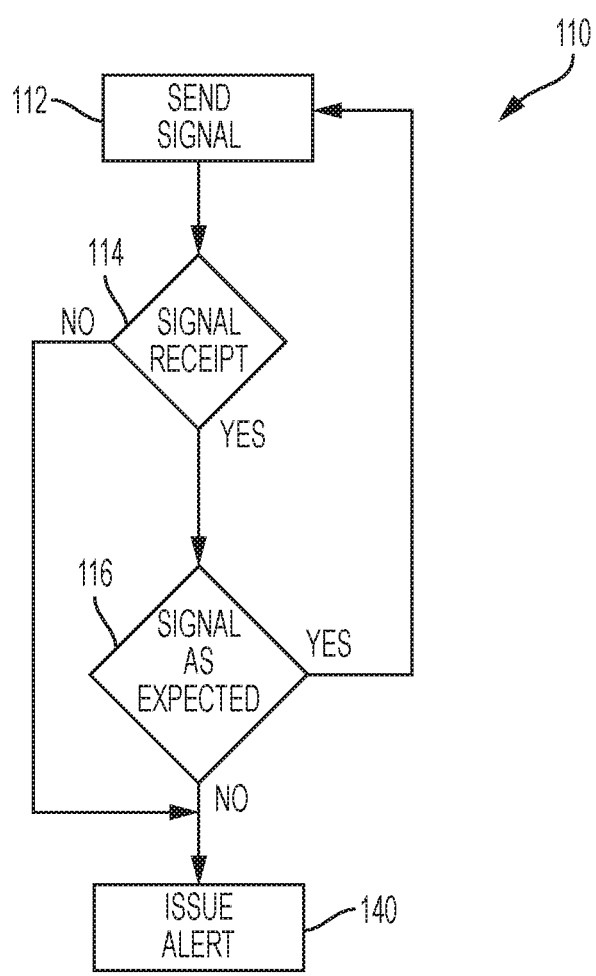
FIG. 4 depicts a flow diagram illustrating a method of monitoring compliant pins, in accordance with an aspect of an exemplary embodiment.
Figure 5:
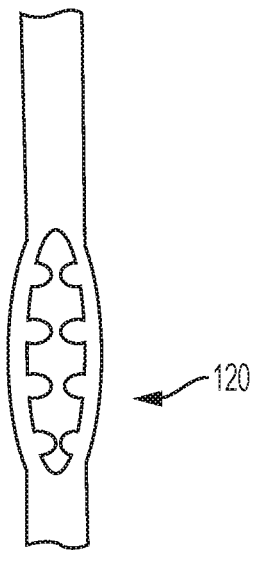
FIG. 5 depicts an installed compliant pin, in accordance with an aspect of an exemplary embodiment.

Reference will now follow to FIG. 4 in describing a method 110 of monitoring compliant pins, in accordance with an exemplary embodiment. In block 112, electrical signals are introduced into each of the first plurality of conductors 64. In block 114, a determination is made whether electrical signals are received at any of the second plurality of conductors 70. If no signals are received, a determination is made that compliant pin 24 has not been properly seated. That is, as shown at 120 in FIG. 5, a gap exists between each of the first plurality of bumps 59 and the second plural of bumps 61 indicating that compliant pin 24 may be loose.

Figure 6:
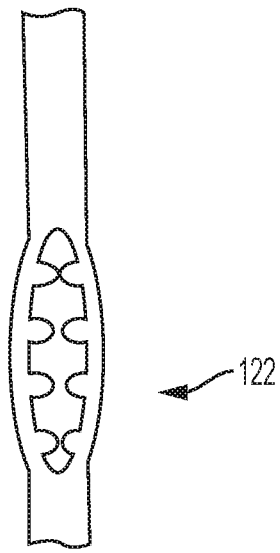
FIG. 6 depicts an installed compliant pin, in accordance with another aspect of an exemplary embodiment.
Figure 7:
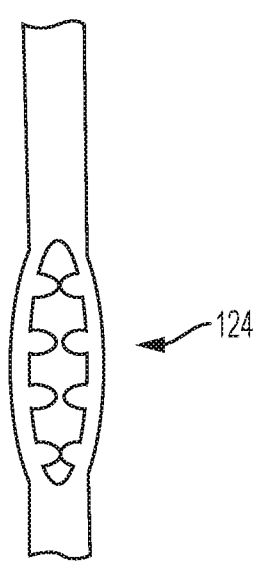
FIG. 7 depicts an installed compliant pin, in accordance with still another aspect of an exemplary embodiment.
Figure 8:
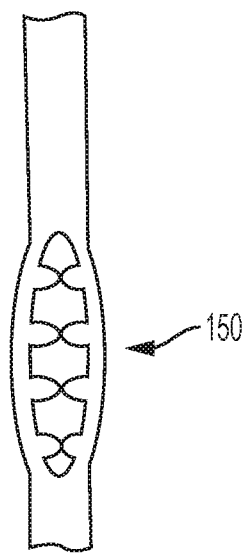
FIG. 8 depicts an installed compliant pin, in accordance with yet another aspect of an exemplary embodiment.

If a signal is present at one or more of the second plurality of conductors, a determination is made in block 116 whether the signal represents an expected signal. For example, if a pin as shown at 122 in FIG. 6, only conducts one signal, pin monitoring module may indicate a problem exists. Similarly, a compliant pin 124 shown in FIG. 7 demonstrates a situation in which two signals are conducting. In such a case, upper and lower portions of compliant pin 124 may be seated while a center section may be loose. If the compliant pin monitoring module 90 determines that a problem exists, an alert may be issued in block 140. FIG. 8 depicts a compliant pin 150 in which each all signals pass indicating a properly seated pin.

At this point, it should be appreciated that the exemplary embodiments describe a system that can monitor installation of an electronic component including compliant pins as well as an operational life of the component to determine when a replacement may be needed. In this manner, components may be replaced prior to failure thereby reducing downtime. The compliant pins include contacts or bumps that are configured to zipper together during installation. That is, as the walls/legs of the compliant pin are brought together, the number of completed circuits progressively increases.

The number of completed circuits may then be read as an indicator of a level of compression on the compliant pin. Changes in the level of compression may provide an indication of relaxation of the walls/legs that may lead to a loose pin and a faulty component. The present embodiments provide a system, in addition to monitoring installation, may provide an early warning for imminent pin rejection.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The terms "about" and "substantially" are intended to include the degree of error associated with measurement of the particular quantity based upon the equipment available at the time of filing the application. For example, "about" and/or "substantially" can include a range of ±8% or 5%, or 2% of a given value.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment of the invention have been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting-data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium, having instructions stored therein, comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:
1. A compliant pin system comprising:
  a pin including a first end, a second end, and an intermediate portion;
  a compliant section provided at the intermediate portion, the compliant section including a first leg and an opposing second leg, the second leg being spaced from the first leg by a deformation zone;
  a first plurality of contact members extending along the first leg;

a second plurality of contact members extending along the second leg, the second plurality of contact members being substantially aligned with the first plurality of contact members;

a first plurality of electrical conductors arranged along the first leg, each of the first plurality of electrical conductors including an end portion terminating at a corresponding one of the first plurality of contacts;

a second plurality of electrical conductors arranged along the second leg, each of the second plurality of electrical conductors including an end section terminating at a corresponding one of the second plurality of contacts; and a pin validation system operatively connected to the first plurality of electrical conductors and the second plurality of electrical conductors, the pin validation system detecting a presence of an electrical signal passing between corresponding pairs of the first plurality of contact members and the second plurality of contact members to determine an integrity of the compliant pin.

2. The compliant pin system according to claim 1, wherein the first plurality of contact members comprises a first plurality of bumps integrally formed with the first leg, and the second plurality of contact members comprises a second plurality of bumps integrally formed with the second leg.

3. The compliant pin system according to claim 1, further comprising: an insulating material coating each of the first and second legs, the first plurality of electrical conductors comprising a first trace formed on the insulating material of the first leg and the second plurality of electrical conductors comprising a second trace formed on the insulating material of the second leg.

4. A method of forming a compliant pin system comprising:
punching an opening into a pin to form a compliant section having a first leg having a first plurality of contact members and an opposing second leg having a second plurality of contact members;
applying a non-conducting material to a surface of the pin;
applying a first plurality of electrical conductors to the first leg;
terminating each of the first plurality of electrical conductors at a corresponding one of the first plurality of contact members;
applying a second plurality of electrical conductors to the second leg; and
terminating each of the second plurality of electrical conductors at a corresponding one of the second plurality of contact members.

5. The method of claim 4, wherein punching the opening includes forming a first plurality of bumps on the first leg defining the first plurality electrical conductors, and a second plurality of bumps on the second leg defining the second plurality of electrical conductors.

6. The method of claim 4, further comprising: connecting a compliant pin validation system to each of the first plurality of electrical conductors and the second plurality of electrical conductors that detects a presence of an electrical signal passing between corresponding pairs of the first plurality of contact members and the second plurality of contact members to determine an integrity of the compliant pin.

7. A method of checking integrity of a compliant pin comprising:
sending a signal along a first plurality of conductors toward a first plurality of contact members extending along a first leg portion of the compliant pin;
inserting the compliant pin into a plated through hole moving the first leg portion and a second leg portion towards one another;
sensing for the signals at a second plurality of contact members extending along the second leg portion through a second plurality of conductor members; and
determining the integrity of the compliant pin based on one of a presence of and absence of the signals at the second plurality of conductor members.

8. The method of claim 7, moving the first leg portion toward the second leg portion includes decreasing a gap between a first plurality of bumps defining the first plurality of contact members and a second plurality of bumps defining the second plurality of contact members.

9. The method of claim 7, wherein determining the integrity of the compliant pin includes detecting an absence of the signals at select ones of the second plurality of contact members.

10. The method of claim 9, wherein determining the integrity of the compliant pin includes determine a presence of the signals at other select ones of the second plurality of contact members.

* * * * *